United States Patent Office 3,623,880

Patented Nov. 30, 1971

3,623,880

METHOD OF DYEING PHOTOSENSITIVE POLYMERS AND MATERIALS SO DYED

Joseph L. Sannella and John F. I. Sharp, Muncie, Ind., assignors to Ball Corporation, Muncie, Ind.

No Drawing. Filed Dec. 20, 1968, Ser. No. 785,797
Int. Cl. G03c *1/68*
U.S. Cl. 96—115 R 22 Claims

ABSTRACT OF THE DISCLOSURE

A method of dyeing photosensitive polymeric materials in nonpolar solvents with water-soluble dyes by including a polar solvent, whereby the dye and polymer remain dispersed upon evaporation of the solvent, the polymer remains accurately photosensitive, and the dye is not leached from the light-struck portion of the polymer in strong developing solvents, a photosensitive polymer dyed with acid violet dye, and graphic arts plates coated with such dyed photosensitive polymer.

The instant invention relates to a method of dyeing photosensitive polymeric materials, to photosensitive materials so dyed, and to graphic arts plates coated with such dyed photosensitive compositions. More particularly, the instant invention relates to a method of dispersing essentially non-compatible dyes in photosensitive polymeric compositions without adversely affecting the photosensitive or physical properties thereof, to such compositions and to graphic arts plates coated with such compositions.

Photosensitive polymeric resist materials for producing accurate masks and oleophilic areas on lithographic plates are well known in the printed circuit, lithographic, and related graphic arts fields. These materials are essentially relatively low molecular weight polymers having a number of unsaturated bonds. With initiators, activators, catalysts or other materials, which may be integral with the polymer or admix therewith, these materials display the capability of undergoing cross-linking upon the exposure to actinic radiation.

The materials may be dissolved in solvents and applied to a substrate as a relatively thin, continuous coating by several conventional means including spraying, roll coating, and dip coating. After removing the solvent by drying, the coating may be exposed image wise to actinic radiation such as light. In the light-struck portions of the coating, the unsaturated bonds are caused to open and mutually react with other open bonds inter and intra molecularly. By this means, the light-struck portion of the coating is caused to cross-link and greatly increase the molecular weight of the polymeric chains involved. These mechanisms are well known and thoroughly discussed in the patent and other literature.

As a result of such exposure and cross-linking, a latent image of higher molecular weight material is produced in the coating. By taking advantage of the differing solubilities of the exposed and unexposed material, it is possible to develop the latent image. A relatively strong developing solvent, often trichloro ethylene, is applied to the exposed coating either as a liquid, spray, or vapor. Exposed areas of the coating, because of the higher effective molecular weight of the cross-linked materials, are not substantially soluble even in a relatively strong solvent. However, the unexposed portions of the coating are not cross-linked and are soluble in the developing solvent. Thus, the latent image is developed as the unexposed portions are washed away by the solvent leaving an image of cross-linked material inhered to the substrate.

In the case of lithographic plates, the substrate is often a grained metal surface, and quite often a grained zinc surface. Such surfaces, when wiped with water, retain the water and thereafter will not accept oil lithographic inks. The image areas corresponding to the light-struck portions of the coating are highly oleophilic and will not accept water. Oily inks are, however, readily accepted by the coating. It can be seen that by applying water to such a plate and then applying ink, the plate can be used to transfer the image to, for instance, paper or metal surfaces. This, in greatly simplified terms, is the manner in which many presensitized lithographic plates are produced and utilized.

Another somewhat similar but less demanding use of photosensitive polymers is in the production of printed circuit boards. In this situation, a nonconducting substrate is laminated or plated with an etchable, electrically conducting layer. The electrically conducting layer is usually rather thin as the structural strength of the board lies in the nonconducting substrate. In a manner analogous to that discussed above, a photosensitive polymer is coated onto the conducting layer of the board. An image of the desired circuit configuration is projected onto the dryed photosensitive polymer to cause cross-linking. Development is accomplished as discussed above. Thus, after development of the photosensitive layer, there exists a nonconducting substrate, a conducting layer, and a pattern of cross-linked photosensitive polymer corresponding to the desired circuit. The cross-linked polymer at this stage is generally referred to as a mask. The exposed metal layer, i.e., that not covered by the mask, is etched down to the nonconducting substrate by placing in an etching solution such as ferric chloride if, as is conventional, the conducting layer is copper. However, the metal layer under the mask is protected from the etchant and thus the desired circuit configuration of the conducting material is obtained. Printed circuit boards constitute a less demanding use than lithography only because of the absence of the need to maintain the oleophobic nature of the substrate. Quality and accuracy of the highest order are required in many printed circuit board applications.

From the above discussion, it will be apparent to those skilled in the art that many similar uses for photosensitive polymers exist. For instance, bimetal lithographic plates and engraved letter press or other printing plates may also be produced.

Obviously all of the graphic arts and related uses of photosensitive polymers require that the developed mask be continuous. Pinholes in the mask would leave unprotected vital areas of the substrate and, in most cases, provide unsatisfactory results. This is not an insurmountable problem in that it is possible to easily repair undesired voids in the mask prior to use or etching as the case may be. However, since the mask is quite thin and of a polymeric material, it is usually transparent or translucent. Therefore, in order to provide inspection of the mask before proceeding with whatever operation is involved, it has been found necessary to dye the mask in a color contrasting to that of the substrate to permit inspection of the integrity and accuracy of the mask. Because of problems which will be discussed more fully below, dyeing is conventionally accomplished after development of the photosensitive polymer. This involves a dyeing, rinsing, and drying step for each piece of work and adds about 20% to 40% to processing time. The advantages of a "pre-dyed" photosensitive polymer are therefore apparent. Unfortunately, the problems and drawbacks have outweighed these advantages until this time.

Heretofore, satisfactory dyes have been provided for inspection purposes only after development of the mask. There are many reasons for this. For instance, dyes soluble in the developing solvent leach out of the photosensitive composition during development, while dyes not soluble in the developing solvent are usually hydrophilic in nature and thus difficult to maintain in solution with the oleophilic photosensitive material. Also, since the polymer is photosensitive as a result of reaction initiated by actinic radiation, and since this reaction must take place through a finite coating of the material, the absorption characteristics of dyes often adversely affect the photosensitivity of the composition by undesirably protecting the photosensitive portions of the polymer from the actinic radiation. In this regard, it must be remembered that contrast is important and the darker and/or more vivid dyes more actively affect the radiation penetration of the coating.

Adhesion of the photosensitive polymer to the substrate is, of course, vital. However, many dyes adversely affect this adhesion and, in many cases, cause loss of smaller portions of the mask not by dissolution in the solvent but by failure of the bond to the substrate as a result of attack by the developing solvent.

Dyes obviously affect the optical qualities of a photosensitive coating. Interference with and/or scattering of the actinic radiation will render a photosensitive coating substantially useless. It is important that the mask resulting from exposure accurately reproduces the image of the exposure. Scattering, of course, can enlarge the image by reflecting the radiation to adjacent supposedly unexposed areas. Such scattering also results in fuzzy edges. Interference can cancel out radiation. It has been found that many dyes adversely affect the fidelity of the image obtainable when incorporated with a photosensitive composition.

In the case of lithography, still another critical and unpredictable complication exists. Since the photosensitive layer covers the entire hydrophilic metal surface before exposure, it is possible for the photosensitive layer to contaminate or otherwise affect the hydrophilic layer during storage to render it partially hydrophobic. In this case, the plate is said to be sensitive or scummy in that ink will adhere to the metal portion after development. Similarly, it is possible to compromise the oleophilic nature of the photosensitive polymer. Unsuitable dyes may produce either of these undesirable results.

It is therefore an object of this invention to provide a dyed photosensitive polymer which accurately reproduces image-wise exposure thereon of actinic radiation upon development in a nonpolar solvent.

Another object of this invention is to provide a dyed photosensitive polymer which, when exposed to actinic radiation, adheres substantially as well in the presence of nonpolar developing solvent as does the undyed photosensitive polymer.

Yet another object of this invention is to provide a photosensitive polymer incorporating a dye not soluble in nonpolar developing solvent.

Still another object of this invention is to provide a method of preparing a solution of dyes soluble in polar solvents and photosensitive polymers soluble in nonpolar solvents.

Yet another object of this invention is to provide a dyed photosensitive polymer which functions as the oleophilic portions of a lithographic plate.

Other objects and advantages of this invention will be apparent from the following description and claims.

Photosensitive polymers to which this invention particularly pertains are the polymeric cinnamic acid esters. These polymers, including the various activators, sensitizers, et cetera, are well known and available in the art. A more detailed discussion of the photosensitive polymers of concern may be found in U.S. Pats. Nos. 2,610,120; 2,670,285; 2,670,286; 2,670,287; 2,690,966; and 2,725,-372.

The instant invention will be discussed and illustrated largely in terms of polyvinyl cinnamates because of the widespread acceptance and availability of these particular photosensitive polymers. However, those skilled in the art will readily recognize the applicability of the instant invention to other photosensitive polymers which are developable in nonpolar solvents.

According to the instant invention, a dye not soluble in the developing solvents is incorporated into a photosensitive polymer by means of a critical blended solvent system. It is necessary to use a "water-soluble" dye in order to impart permanence to the dyed photosensitive polymer when developed by a nonpolar developing solvent. A solution containing both polar and nonpolar constituents is necessary to achieve a satisfactory admixture of the basically incompatible, organic, solvent-soluble photosensitive polymer and water-soluble dye. Further, for optimum results, it is important that the solvent system display a substantially stable ratio of the two or more components upon evaporation to maintain the equilibrium of the system during drying of the coating of photosensitive polymer. The final result is, in essence, a thorough dispersion of the dye within the photosensitive polymer resulting from deposition when the solvent system is evaporated. Only through a carefully selected and balanced solvent system can this fine dispersion be maintained throughout evaporation of the solvent. If evaporation rates are not equal, or if other adverse factors are involved, one or the other component will be prematurely deposited out of solution, resulting in a separation of the dye from the photosensitive polymer.

In the case of certain solvents having both hydrophobic and hydrophilic portions in the molecule, it is possible to operate with a single solvent system. This, however, is due only to the surfactant nature of the solvent and, as a generality, the results obtainable with such "dual nature" solvents have been somewhat inferior to those obtained with the two or more solvent systems.

The effect of a dye admixed in a photosensitive polymer upon the operation of that photosensitive polymer is not predictable. Preliminary testing may be carried out to establish non-solubility in nonpolar developers in order to roughly establish the groupings of dyes which will be "permanent" in normal uses. On occasion, though, even such "permanent" dyes will wash out in actual tests of photosensitive polymers when developed in a conventional nonpolar solvent. Also, a dye can predictably be chosen for its color in contrast.

On the other hand, effect of a dye upon adhesion of a photosensitive polymer to a substrate is not predictable. Similarly, the effect of a dye upon the accuracy of reproduction and upon the sensitivity to ink in litho applications are not predictable. As set forth above, many of these qualities are sometimes in conflict. For instance, the more vividly colored dyes which have desirable contrast tend to produce more adverse effects with regard to the photosensitive mechanism. Extensive tests have shown that a single dye rarely meets all, or most, of the criteria satisfactorily.

It has been found, however, that a dye having the Colour Index Name Acid Blue 75, Colour Index Number 42576, and the following formula:

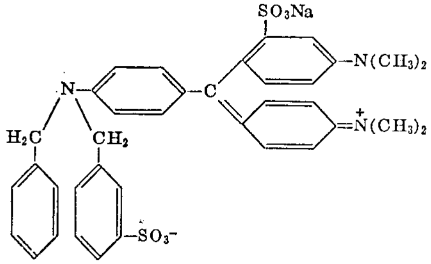

displays the unexpected quality of dyeing a photosensitive polymer in a satisfactory manner according to the above-discussed requirements. This compound is commercially known as Acid Violet 4BL Concentrate and is available from General Aniline & Film Corporation. When incorporated in cinnamic acid ester photosensitive polymers in amounts between 0.5% and 16% by weight, this dye lends excellent contrast to the polymer while not adversely affecting adhesion, accurate reproduction and compatibility with lithographic and other conventional uses for the photosensitive polymer. Amounts outside this preferred range are operable but yield less desirable results.

The solvent systems usable for incorporating the above dye, hereinafter referred to as acid violet, include cyclohexanone, 2-methoxy-ethyl acetate, 2-ethoxy-ethyl acetate, and methylene chloride as nonpolar solvents and dimethyl formamide, dimethyl acetamide, and 2-ethoxy-ethanol as polar solvents, in amounts wherein between 80% and 20% of the solvent system is polar solvent. Instead of a single polar and nonpolar solvent, mixtures of such solvents may be employed provided the overall amount of a given type of solvent is maintained within the above ratio.

While the amount of dye is important relative to the photosensitive polymer, and the composition of the solvent system is important, the amount of solvent system relative to the dye and polymer is not critical. As with any coating system, there must be sufficient solvent to provide a solution and not so much as to overly dilute the solute. Between these obvious extremes only adjustments for the coating process employed and other such external consideration need be made since the mechanism of this invention will function satisfactorily.

The operation and advantages of this invention will be more readily understood upon consideration of the following examples.

EXAMPLE I

To 100 ml. of a commerical photosensitive polyvinyl cinnamate solution (28% solids and 72% methylene chloride) was added 400 ml. of a solution containing 2.5 grams acid violet dye and equal parts of dimethyl formamide and 2-methoxy-ethyl acetate. The solution thus formed was whirl-coated onto a zincated aluminum plate at 85 r.p.m. and 90° F. for one minute and then dried in a forced-air gas oven at 265° F. for three minutes. The amount of dye photoresist on the plate was .14 to .18 gram per one-hundred square inches of substrate. It was a smooth, even film with no noticeable dye or polymer precipitation. After cooling, a portion of the coated plates was exposed to a carbon arc, ultraviolet light source through a test negative and developed in a trichloro ethylene spray. Another portion was exposed to 150–A screen negative. Adhesion was tested by rubbing the image four strokes with a pencil eraser and was considered satisfactory if the image held. The 150–A screen portion of the negative was held under a 40-pounds per square inch spray of trichloro ethylene for 10 seconds. No loss of detail resulted from this test. Constrast between the dyed photoresist and background metal plate was found to be good by visual examination. Dots were examined for size and haloing after conventional lithographic desensitization. A 110-line, 10% screen negative of the coated plate made according to this example was examined under 40× magnification and found to have dots with a range of .0035 to .004 of an inch. Lithographic sensitivity was measured by applying a conventional developing ink, rubbing the ink to dryness, and then rinsing the plate with water while lightly rubbing. When ink remained in the non-image area after rinse, the plate was considered to be undesirably sensitive. However, no such undesirable sensitivity was found with the plate of this example. The dyed photosensitive polymer thus performed satisfactorily.

EXAMPLE II

The procedure of Example I was repeated except the solvent system was altered to 70% dimethyl formamide and 30% 2-methoxy-ethyl acetate. The same advantageous results were found.

EXAMPLE III

The procedure of Example I was repeated except the solvent system was altered to 50% 2-ethoxy ethanol, 25% cyclohexanone, and 25% 2-methoxy-ethyl acetate. The same advantageous results were found.

The following table illustrates the advantageous results of the above examples when compared with a number of other similar dyes tested in the same manner. Dot size, adhesion, color and contrast were measured as in the examples. Haloing was established by examination under a 40× microscope and subjectively evaluated.

TABLE

| Dye | Solvents | Dot size | Halo | Adhesion | Color | Contrast |
|---|---|---|---|---|---|---|
| Azosol Fast Black MA | 100% cyclohexanone | 5½ | Large | Poor | Blue-black | Poor. |
| Azosol Fast Brillant Red B | do | None | None | Very bad | Red | Do. |
| Azosol Fast Blue HLR | do | 5 | Large | Fair-good | Blue-green | Fair. |
| Basic Fuchsin | do | None | None | Very bad | Red | Poor. |
| Celliton Black BGA | do | 4½ | Slight | Fair | Brown | Do. |
| Chromogen Black T-160 | do | None | None | Very bad | Red | Do. |
| Crystal Violet | do | 4 to 4½ | Fair | Good | Purple | Fair. |
| Diamond Black PLC | do | None | None | Very bad | Red | Poor. |
| Diamond Black PBBA Extra | do | do | do | do | do | Do. |
| Erichrome Black T | do | do | do | do | Bluish-purple | Do. |
| Fuschin Red | do | do | do | do | Red | Do. |
| Basic Black KMPA | do | do | do | do | Blue black | Do. |
| Methylene Blue | do | 4½ to 5 | Large | Fair | Purple | Fair-good. |
| New Fuchsin | do | None | None | Very bad | Red | Poor. |
| Pararosaniline Acetate | do | do | do | do | do | Do. |
| Permanent Violet D | do | 4½ to 5 | Slight | Fair | Purple | Fair-good. |
| Crystal Violet | 50 DMF; 50 cyclohexanone | 4 to 5 | Fair | Fair-good | Blue-purple | Good. |
| Malachite Green | 50 DMF; 50 MCA | 5 | None | do | Light green | Poor-fair. |
| Methylene Blue | Same as above | None | do | Poor | Purple | Fair. |
| Methyl Violet 2B | do | do | do | Very bad | do | None. |
| Chromogene Black T160 | do | do | do | do | Dark Red | Fair. |
| Diamond Black PLC | do | 5 | Slight | Fair | do | Do. |
| Azosol Fast Black MA | do | 5 to 6 | Very large | Very bad | Blue-violet | Poor. |
| Carbol Fuchsin | do | None | None | do | Red | Do. |
| Aniline Blue Black | do | 5 to 6 | Slight | Fair | Very light blue | Fair-Poor. |
| Trypon Blue | do | 4½ to 5 | do | Fair-poor | Light purple | Do. |
| Brilliant Blue 2GLN | do | 4 to 5 | Slight to fair | Fair | Blue | Fair. |
| Acid Alizarin Grey GNN | do | 5 | Slight | Good | Black | Do. |
| Chrome Leather Fast Black SG | do | 4½ | Very slight | do | do | Fair-good. |
| Fast Sulfon Black NB conc | do | None | None | Very bad | Purple | Poor. |
| Sulphon Cyanine Black DN | do | 5 | Bad | Poor | Dull black-purple | Do. |
| Sulphon Cyanine Black BA | do | 5 | Slight | Good | Blue-black | Fair. |
| Anthraquinone Violet D | do | 6 | Very bad | Poor | Purple | Do. |
| Erichrome Black T | do | None | None | Very bad | Blue | Poor. |
| Alizarin Blue Black BA Extra | do | 3½ to 4 | Fair | Fair-good | Purple | Poor-fair. |
| Alizarin Blue Black NBA | do | 5 | do | do | Purple-black | Fair-good. |
| Acid Black NCB | do | 5 | do | do | Blue-black | Fair. |
| Alphazurine A | 70 DMF; 30 MCA | 4 to 4½ | Good | do | Blue-green.* | Fair-poor. |
| Superchrome Blue B | Same as above | None | None | Very bad | Purple | |

TABLE—Continued

| Dye | Solvents | Dot size | Halo | Adhesion | Color | Contrast |
|---|---|---|---|---|---|---|
| Ponceau 3R | do | 4 to 5 | Fair | Good | Brown | Do. |
| Poirrier's Blue | do | 5 | do | do | Blue | Do. |
| Phenosafarin | do | None | None | Very bad | Red | Poor. |
| Mordant Blue B | do | 3½ to 4 | Slight | Fair-good | Purple | Good. |
| Gallocyanine | do | 5 | Bad | Very bad | Reddish-purple | Fair. |
| Ethyl Violet | do | None | None | do | Light blue | Poor. |
| Mordant Blue | do | 4 to 5 | Fair | Good | Red | Fair-good. |
| Anthraquinone Violet R | do | 4 | Bad | Poor | Blue-purple | Poor. |
| Aniline Blue Black | do | 3½ to 4 | Slight to fair | Fair | Dark red | Do. |
| New Fuchsin | 50 DMF; 50 MCA | None | None | Very bad | Red | Do. |
| Diamond Black PBBA Extra | Same as above | do | do | do | do | Do. |
| Basic Black KMPA | do | do | do | do | Blue-Black | Do. |
| Acid Violet | do | 3½ to 4 | Good | Good | Purple-Blue | Good. |
| Do | 70 DMF; 30 MCA | do | do | do | do | Do. |
| Do | 50 2-ethoxy ethanol; 25 cyclohexanone; 25 MCA. | do | do | do | do | Do. |
| Celliton Violet BA | MCA | 4 | None | do | Violet | Poor. |
| Orasol Brillant Blue GN | Same as above | 4 | do | do | Pale Blue | Do. |
| Oil Blue CSP | do | 4 | do | do | Blue | Do. |
| Eastman Polyester Blue 4RLSW | do | 4 | do | do | do | Do. |
| Janus Green | do | 4 | do | do | Green | Do. |
| Victoria Green Base | do | 4 | do | do | do | Do. |

NOTE: MCA=2-methoxy-ethyl acetate; DMF=Dimethyl formamide.

From the above examples and table, it will be apparent that the method of the instant invention is widely used for incorporating basically incompatible dyes into photosensitive polymer compositions. However, as is particularly apparent from the table, many of the dyes adversely affected the photosensitive nature of the polymer, or the physical properties of the polymer. The acid violet dye was almost unique in permitting the photosensitive dye to be vividly colored while maintaining excellent photosensitive and physical properties.

It will be apparent from the above description that various modifications of the method and materials may be made within the scope of the invention. Therefore, the invention is not intended to be limited to the particular examples or illustrations employed except as may be required by the following claims.

What is claimed is:

1. A dyed coating capable of being cross-linked by actinic radiation comprising a thorough dispersion of photosensitive cinnamic acid ester polymer and acid violet dye.

2. A dyed coating capable of being cross-linked by actinic radiation as set forth in claim 1 wherein the dye is present in amounts between 0.5% and 16% by weight of the polymer.

3. A dyed coating capable of being cross-linked by actinic radiation as set forth in claim 1 wherein the coating is present as a thin, even layer on a substrate.

4. A dyed coating capable of being cross-linked by actinic radiation as set forth in claim 3 wherein the substrate has a zinc surface.

5. A dyed coating as set forth in claim 3 wherein the substrate is a lithographic plate.

6. A dyed coating capable of being cross-linked by actinic radiation as set forth in claim 3 wherein the substrate is a circuit board.

7. A dyed coating capable of being cross-linked by actinic radiation as set forth in claim 3 wherein the substrate is a photoengraving plate.

8. A photosensitive element comprising a substrate having thereon a thin, even layer of a thorough dispersion of polyvinyl cinnamic ester polymer capable of being cross-linked by actinic radiation and acid violet dye, the dye being present in amounts between 0.5% and 16% by weight of the polymer.

9. A coating composition for producing dyed surfaces capable of being cross-linked by actinic radiation comprising a solution of photosensitive cinnamic acid ester polymer and acid violet dye in a solvent system comprising mixtures of polar and nonpolar solvents.

10. A coating composition as set forth in claim 9 wherein the polar solvent is present in amounts between 80% and 20% of the solvent system.

11. A coating composition as set forth in claim 9 wherein the dye is present in amounts between 0.5% and 16% by weight of the polymer capable of being cross-linked by actinic radiation.

12. A coating composition for producing dyed surfaces capable of being cross-linked by actinic radiation comprising a solution of photosensitive cinnamic acid ester polymer and acid violet dye in cyclohexanone.

13. A coating composition for producing dyed coatings capable of being cross-linked by actinic radiation comprising a solution of photosensitive polyvinyl cinnamic ester polymer and acid violet dye, said dye being present in amounts between 0.5% and 16% by weight of the polymer, in a solvent comprising mixtures of polar and nonpolar solvents.

14. A coating composition as set forth in claim 13 wherein the solvent system comprises dimethyl formamide and 2-methoxy-ethyl acetate, wherein the 2-methoxy-ethyl acetate is present in amounts between 20% and 80% of the solvent system.

15. A method of blending oleophilic, polymers capable of being cross-linked by actinic radiation and hydrophilic dyes comprising mixing at least one polar solvent for a photosensitive polymer and at least one nonpolar solvent for the dye, the two solvents having substantially equal vapor pressures, forming a solution of the photosensitive polymer and the dye in the thus formed solvent system, coating the solution onto a substrate, and evaporating the solvent whereby the photosensitive polymer and dye are deposited on the substrate as a thorough dispersion.

16. A method as set forth in claim 15 wherein the polar solvent comprises between 20% and 80% of the solvent system.

17. A method as set forth in claim 16 wherein the dye is present in amounts between 0.5% and 16% by weight of the polymer capable of being cross-linked by actinic radiation.

18. A method as set forth in claim 17 wherein the polymer capable of being cross-linked by actinic radiation is a photosensitive cinnamic acid ester polymer.

19. A method as set forth in claim 17 wherein the dye is acid violet dye.

20. A method of forming a dyed coating capable of being cross-linked by actinic radiation comprising mixing at least one polar solvent and at least one nonpolar solvent to form a solvent system, dissolving a photosensitive cinnamic acid ester polymer and acid violet dye in the solvent system, coating the thus formed solution onto a substrate and removing the solvent whereby the photosensitive polymer and dye are deposited on the substrate as a thorough dispersion.

21. A method as set forth in claim 20 wherein the polar solvent comprises between 20% and 80% of the solvent system.

22. A method as set forth in claim 20 wherein the dye is present in amounts between 0.5% and 16% by weight of the polymer capable of being cross-linked by actinic radiation.

References Cited

UNITED STATES PATENTS

| | | | |
|---|---|---|---|
| 2,690,966 | 1/1951 | Minsk et al. | 96—115 |
| 3,508,923 | 4/1970 | Pickard | 117—34 |

OTHER REFERENCES

Kirk-Othmer, Encyclopedia of Chemical Technology, vol. 7 (1965), p. 521.

MORRIS LIEBMAN, Primary Examiner

S. M. PERSON, Assistant Examiner

U.S. Cl. X.R.

96—36.1; 117—34; 260—31.2 R, 32.8 R, 41 C